United States Patent
Huang

(10) Patent No.: US 11,936,354 B2
(45) Date of Patent: Mar. 19, 2024

(54) AMPLIFIER CIRCUIT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 4 days.

(21) Appl. No.: 17/740,388

(22) Filed: May 10, 2022

(65) Prior Publication Data

US 2023/0075807 A1 Mar. 9, 2023

(30) Foreign Application Priority Data

Sep. 7, 2021 (TW) .................. 110133245

(51) Int. Cl.
*H03F 3/45* (2006.01)
*H03F 1/02* (2006.01)

(52) U.S. Cl.
CPC ....... *H03F 3/45269* (2013.01); *H03F 1/0216* (2013.01); *H03F 2203/45154* (2013.01)

(58) Field of Classification Search
CPC ............... H03F 3/45269; H03F 1/0216; H03F 2203/45154; H03F 3/45188
USPC ................................................ 330/252–261
See application file for complete search history.

(56) References Cited

U.S. PATENT DOCUMENTS 7,439,775 B2   10/2008  Sohn
10,284,145 B2 *  5/2019  Sun .................. H03K 3/35613

FOREIGN PATENT DOCUMENTS

TW         200828333 A      7/2008

OTHER PUBLICATIONS

OA letter of the counterpart TW application (appl. No. 110133245) mailed on Jan. 27, 2022. Summary of OA letter: (1) Claim(s) 1 and 9 is/are rejected under Patent Law Article 22(1) as being anticipated by reference 1 (TW 200828333A).) Claim correspondence between the TW counterpart application and the instant US application: Claims 1-10 in the TW counterpart application correspond to claims 1-8, 10 and 15 in the instant US application, respectively.

* cited by examiner

*Primary Examiner* — Hieu P Nguyen
(74) *Attorney, Agent, or Firm* — WPAT, P.C

(57) ABSTRACT

An amplifier circuit is provided. The amplifier circuit outputs a pair of differential output signals through a first output terminal and a second output terminal. The amplifier circuit includes a first amplifier stage electrically connected to a first node and a second node for amplifying a pair of differential input signals; a second amplifier stage which is electrically connected to the first node and the second node and coupled to the first output terminal and the second output terminal; a first switch, coupled between the first output terminal and a first reference voltage; a second switch, coupled between the second output terminal and the first reference voltage; a third switch, coupled between the first node and the first reference voltage; a fourth switch coupled between the second node and the first reference voltage; and a fifth switch coupled between a second reference voltage and the first amplifier stage.

20 Claims, 11 Drawing Sheets

AMPLIFIER CIRCUIT

BACKGROUND OF THE INVENTION

1. Field of the Invention

The present invention generally relates to amplifier circuits, and, more particularly, to amplifier circuits with high gain.

2. Description of Related Art

FIG. 1 is a circuit diagram of a conventional amplifier circuit. The amplifier circuit 100 includes a transistor 101, a transistor 102, a transistor 103, a transistor 104, and a transistor 105. The amplifier circuit 100 receives a pair of differential input signals (including the input signal Vip and the input signal Vin) through the gate of the transistor 101 and the gate of the transistor 102 and outputs the amplified signal through the output terminal Di- and the output terminal Di+. The transistor 103, the transistor 104, and the transistor 105 receive the clock CK through their gates and are turned on or off according to the clock CK. In the figure, "VDD" indicates the power supply voltage, and "GND" indicates the ground level. The operating principle of the amplifier circuit 100 is known to people having ordinary skill in the art, and the details are thus omitted for brevity. However, the gain of the conventional amplifier circuit 100 of FIG. 1 is not good enough.

SUMMARY OF THE INVENTION

In view of the issues of the prior art, an object of the present invention is to provide amplifier circuit, so as to make an improvement to the prior art.

According to one aspect of the present invention, an amplifier circuit having a first output terminal and a second output terminal is provided. The amplifier circuit includes a first transistor having a first terminal, a second terminal, and a first control terminal, the second terminal being coupled to the first output terminal; a second transistor having a third terminal, a fourth terminal, and a second control terminal, the fourth terminal being coupled to the second output terminal; a third transistor having a fifth terminal, a sixth terminal, and a third control terminal, the sixth terminal being coupled to the first terminal, and the third control terminal receiving a first input signal; a fourth transistor having a seventh terminal, an eighth terminal, and a fourth control terminal, the seventh terminal being coupled to the fifth terminal, the eighth terminal being coupled to the third terminal, and the fourth control terminal receiving a second input signal; a first switch having a ninth terminal and a tenth terminal, the ninth terminal being coupled to a first reference voltage, and the tenth terminal being coupled to the first output terminal; a second switch having an eleventh terminal and a twelfth terminal, the eleventh terminal being coupled to the first reference voltage, and the twelfth terminal being coupled to the second output terminal; a third switch having a thirteenth terminal and a fourteenth terminal, the thirteenth terminal being coupled to the first reference voltage, and the fourteenth terminal being coupled to the first terminal and the sixth terminal; a fourth switch having a fifteenth terminal and a sixteenth terminal, the fifteenth terminal being coupled to the first reference voltage, and the sixteenth terminal being coupled to the third terminal and the eighth terminal; and a fifth switch having a seventeenth terminal and an eighteenth terminal, the seventeenth terminal being coupled to a second reference voltage, and the eighteenth terminal being coupled to the fifth terminal and the seventh terminal. The first input signal and the second input signal are a pair of differential input signals, and the first output terminal and the second output terminal output a pair of differential output signals.

According to another aspect of the present invention, an amplifier circuit that outputs a pair of differential output signals through a first output terminal and a second output terminal is provided. The amplifier circuit includes a first amplifier stage electrically connected to a first node and a second node and configured to amplify a pair of differential input signals; a second amplifier stage electrically connected to the first node and the second node and coupled to the first output terminal and the second output terminal; a first switch coupled between the first output terminal and a first reference voltage; a second switch coupled between the second output terminal and the first reference voltage; a third switch coupled between the first node and the first reference voltage; a fourth switch coupled between the second node and the first reference voltage; and a fifth switch coupled between a second reference voltage and the first amplifier stage.

The amplifier circuits of the present invention provide a high gain.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes amplifier circuits. On account of that some or all elements of the amplifier circuits could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following description, each transistor has a first terminal, a second terminal, and a control terminal. When the transistor is used as a switch, the first terminal and the second terminal of the transistor are two terminals of the switch, and the control terminal controls the switch (transistor) to turn on or off. For Metal-Oxide-Semiconductor Field-Effect Transistors (MOSFETs), the first terminal can be one of the source and the drain, the second terminal can be the other of the source and the drain, and the control terminal is the gate. For bipolar junction transistors (BJTs), the first terminal can be one of the collector and the emitter, the second terminal can be the other of the collector and the emitter, and the control terminal is the base.

Figure 1:
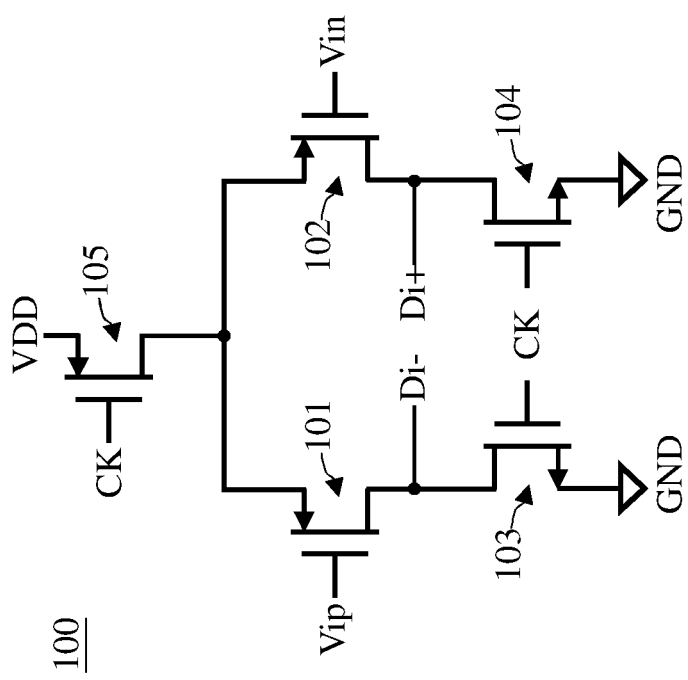
FIG. 1 is a circuit diagram of a conventional amplifier circuit.
Figure 2:
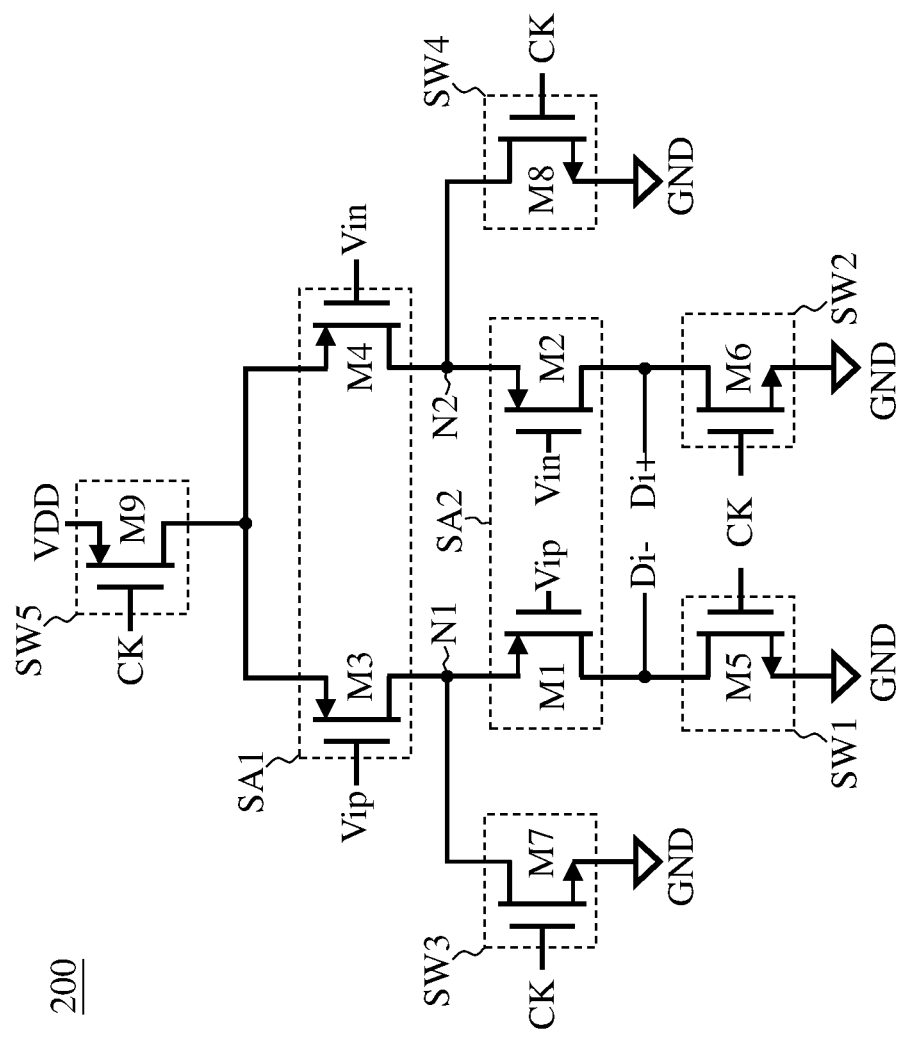
FIG. 2 is a circuit diagram of an amplifier circuit according to an embodiment of the present invention.

FIG. 2 is a circuit diagram of an amplifier circuit according to an embodiment of the present invention. The amplifier circuit 200 includes a transistor M1, a transistor M2, a transistor M3, a transistor M4, a switch SW1, a switch SW2, a switch SW3, a switch SW4, and a switch SW5. The switch SW1, the switch SW2, the switch SW3, the switch SW4, and the switch SW5 are respectively embodied by a transistor M5, a transistor M6, a transistor M7, a transistor M8, and a transistor M9. In the embodiment of FIG. 2, the transistor M1, the transistor M2, the transistor M3, the transistor M4, and the transistor M9 are the P-channel metal-oxide semifield effect transistors (hereinafter referred to as PMOS transistors), while the transistor M5, the transistor M6, transistor M7, and transistor M8 are the N-channel metal-oxide semi-field effect transistors (hereinafter referred to as NMOS transistors).

The first terminal of the transistor M1 is coupled or electrically connected to the first terminal of the transistor M3; the second terminal of the transistor M1 is the output terminal Di− of the amplifier circuit 200 and is coupled to the first reference voltage GND (e.g., ground) through the switch SW1; the control terminal of the transistor M1 receives the input signal Vip. The first terminal of the transistor M2 is coupled or electrically connected to the first terminal of the transistor M4; the second terminal of the transistor M2 is the output terminal Di+ of the amplifier circuit 200, and is coupled to the first reference voltage GND through the switch SW2; the control terminal of the transistor M2 receives the input signal Vin. The input signal Vip and the input signal Vin form a pair of differential input signals. "Di−" and "Di+" can also indicate a pair of differential output signals outputted through the output terminal Di− and the output terminal Di+.

The second terminal of the transistor M3 is coupled or electrically connected to the second terminal of the transistor M4; the second terminal of the transistor M3 and the second terminal of the transistor M4 are coupled to the second reference voltage VDD (e.g., a power supply voltage, the second reference voltage VDD being different from the first reference voltage GND) through the switch SW5. The control terminal of the transistor M3 receives the input signal Vip, and the control terminal of the transistor M4 receives the input signal Vin.

One terminal of the switch SW3 is coupled or electrically connected to the first reference voltage GND, and the other terminal of the switch SW3 is coupled or electrically connected (e.g., through the node N1) to the first terminal of the transistor M1 and the first terminal of the transistor M3. One terminal of the switch SW4 is coupled or electrically connected to the first reference voltage GND, and the other terminal of the switch SW4 is coupled or electrically connected (e.g., through the node N2) to the first terminal of the transistor M2 and the first terminal of the transistor M4.

The switch SW1, the switch SW2, the switch SW3, the switch SW4, and the switch SW5 all operate according to the clock CK. When the clock CK is at the first level (e.g., a high level or logic 1), the switch SW1, the switch SW2, the switch SW3, and the switch SW4 are turned on, while the switch SW5 is turned off; in this instance, the amplifier circuit 200 operates in a reset phase. When the clock CK is at the second level (e.g., a low level or logic 0), the switch SW1, the switch SW2, the switch SW3, and the switch SW4 are turned off, while the switch SW5 is turned on; in this instance, the amplifier circuit 200 operates in an amplification phase.

The transistor M3 and the transistor M4 form the first amplifier stage SA1 of the amplifier circuit 200, while the transistor M1 and the transistor M2 form the second amplifier stage SA2 of the amplifier circuit 200. The first amplifier stage SA1 and the second amplifier stage SA2 are coupled or electrically connected to the node N1 and the node N2. Specifically, the first terminal of the transistor M1 and the first terminal of the transistor M3 are coupled or electrically connected to the node N1; the first terminal of the transistor M2 and the first terminal of the transistor M4 are coupled or electrically connected to the node N2.

The first amplifier stage SA1 amplifies the input signal Vip and the input signal Vin, and generates a first amplified signal at the first terminal of the transistor M3 and the first terminal of the transistor M4. The second amplifier stage SA2 amplifies the input signal Vip and the input signal Vin, and generates a second amplified signal (i.e., the output signal of the amplifier circuit 200) at the output terminal Di− and the output terminal Di+. The second amplifier stage SA2 functions as a common-source amplifier stage in the amplifier circuit 200; that is, by means of the common-source amplification, the second amplifier stage SA2 further amplifies the amplified output of the transistor M3 and the transistor M4 (i.e., the first amplified signal). In detail, because the signals at the control terminals of the second amplifier stage SA2 are the input signal Vip and the input signal Vin, and the signals at the first terminals of the second amplifier stage SA2 are the first amplified signal (i.e., the amplified input signal Vip and the amplified input signal Vin), the amplification that the second amplifier stage SA2 performs is based on the signals associated with the input signal Vip and the input signal Vin. Therefore, the amplifier circuit 200 has a greater gain than the conventional amplifier circuit 100.

Figure 3:
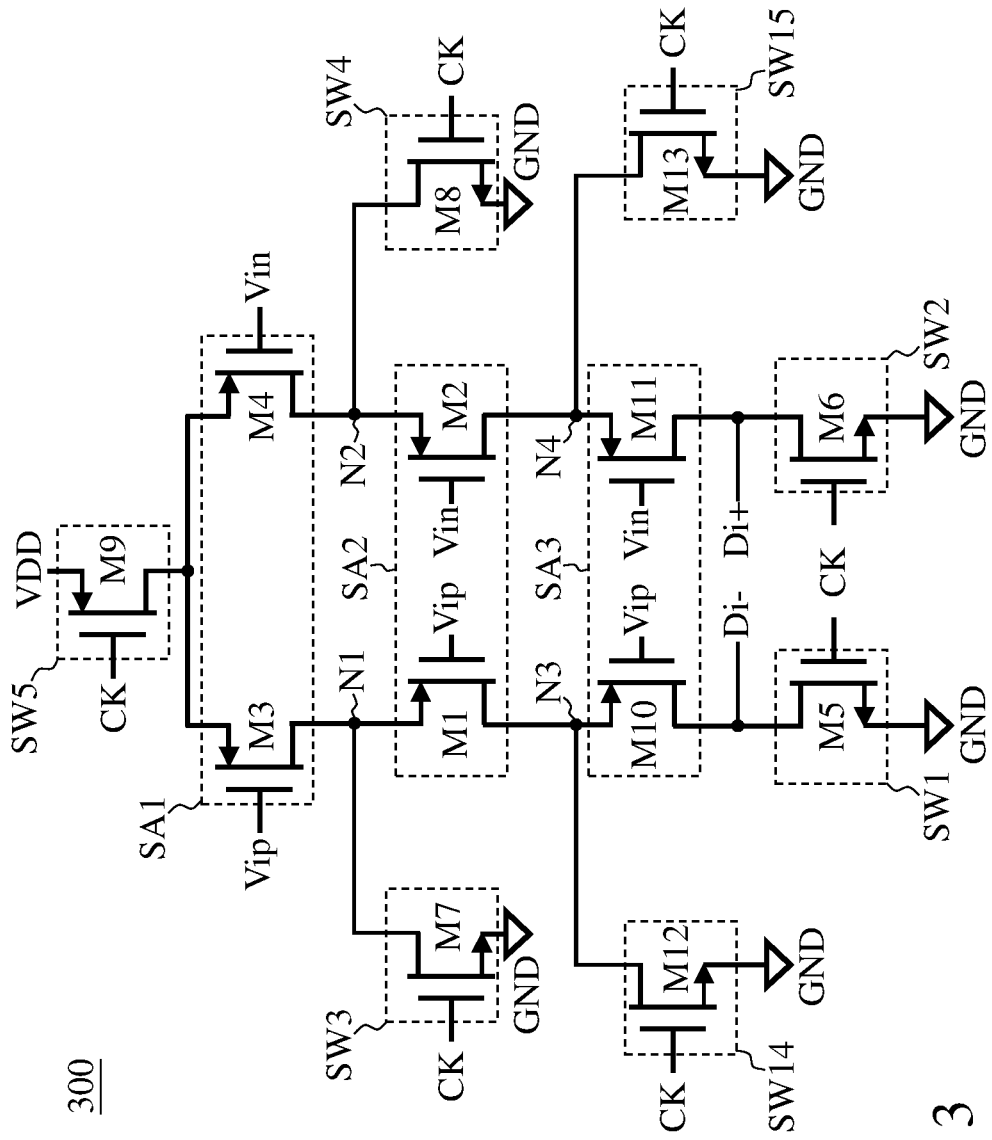
FIG. 3 is a circuit diagram of the amplifier circuit according to another embodiment of the present invention.

FIG. 3 is a circuit diagram of the amplifier circuit according to another embodiment of the present invention. The amplifier circuit 300 is similar to the amplifier circuit 200, except that the amplifier circuit 300 further includes a transistor M10, a transistor M11, a switch SW14, and a switch SW15. The amplifier circuit 300 includes three amplifier stages, and the transistor M10 and the transistor M11 are the third amplifier stage SA3 of the amplifier circuit 300. The second amplifier stage SA2 is arranged between the first amplifier stage SA1 and the third amplifier stage SA3. The switch SW14 is embodied by the transistor M12, and the switch SW15 is embodied by the transistor M13. In the embodiment of FIG. 3, the transistors M10 and M11 are PMOS transistors, while the transistors M12 and M13 are NMOS transistors.

The first terminal of the transistor M10 is coupled or electrically connected (e.g., through the node N3) to the second terminal of the transistor M1; the second terminal of the transistor M10 is the output terminal Di− of the amplifier circuit 300, and is coupled to the first reference voltage GND through the switch SW1; the control terminal of the transistor M10 receives the input signal Vip. The first terminal of the transistor M11 is coupled or electrically connected (e.g., through the node N4) to the second terminal of the transistor M2; the second terminal of the transistor M11 is the output terminal Di+ of the amplifier circuit 300, and is coupled to the first reference voltage GND through the switch SW2; the control terminal of the transistor M11 receives the input signal Vin.

The second amplifier stage SA2 and the third amplifier stage SA3 are coupled or electrically connected to the node N3 and the node N4. Specifically, the second terminal of the transistor M1 and the first terminal of the transistor M10 are coupled or electrically connected to the node N3; the second terminal of the transistor M2 and the first terminal of the transistor M11 are coupled or electrically connected to the node N4.

One terminal of the switch SW14 is coupled or electrically connected to the first reference voltage GND, and the other terminal of the switch SW14 is coupled or electrically connected to the first terminal of the transistor M10 and the second terminal of the transistor M1. One terminal of the switch SW15 is coupled or electrically connected to the first reference voltage GND, and the other terminal of the switch SW15 is coupled or electrically connected to the first terminal of the transistor M11 and the second terminal of the transistor M2.

The switch SW14 and the switch SW15 operate according to the clock CK. When the clock CK is at the first level (e.g., the high level or logic 1), the switch SW14 and the switch SW15 are turned on; when the clock CK is at the second level (e.g., the low level or logic 0), the switch SW14 and the switch SW15 are turned off.

The third amplifier stage SA3 functions as a common-source amplifier stage in the amplifier circuit 300; that is, by means of the common-source amplification, the third amplifier stage SA3 further amplifies the amplified output of the second amplifier stage SA2 (i.e., the second amplified signal). In detail, because the signals at the control terminals of the third amplifier stage SA3 are the input signal Vip and the input signal Vin, and the signals at the first terminals of the third amplifier stage SA3 are the second amplified signal (i.e., the input signal Vip which has been amplified twice and the input signal Vin which has been amplified twice), the amplification that the third amplifier stage SA3 performs is based on the signals associated with the input signal Vip and the input signal Vin. Therefore, the amplifier circuit 300 has a greater gain than the amplifier circuit 200.

The amplifier circuit of the present invention is not limited to three amplifier stages, and people having ordinary skill in the art can implement more amplifier stages according to the above discussions.

Figure 4:
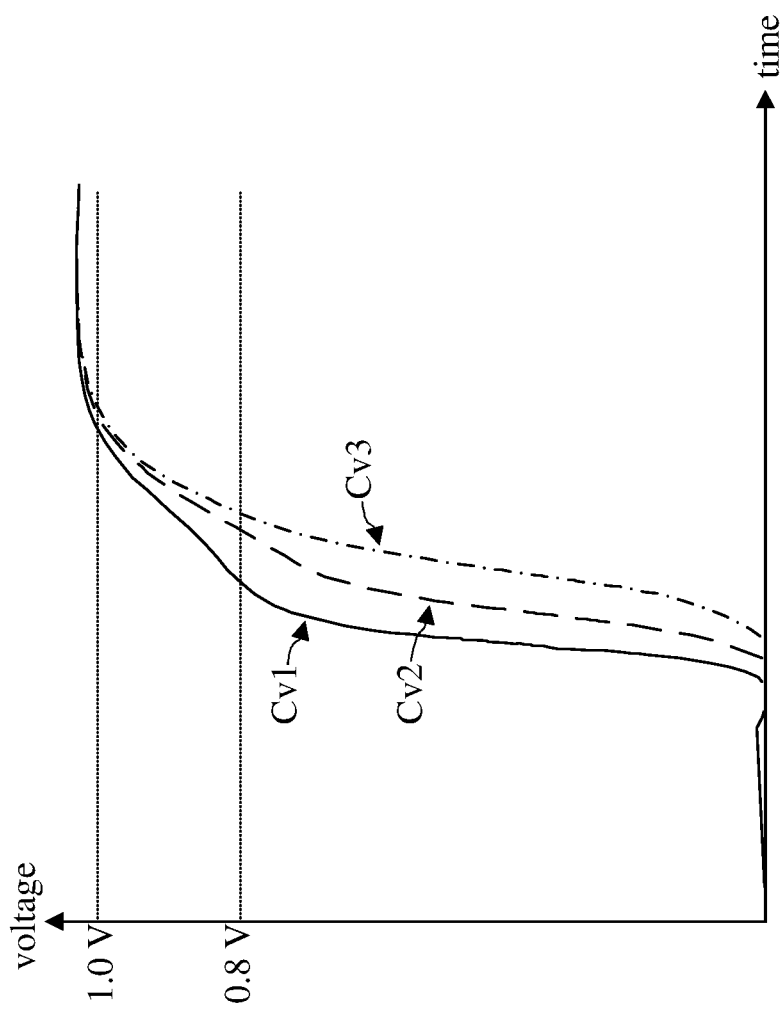
FIG. 4 is a diagram illustrating the turn-on sequence of the amplifier stages of the amplifier circuit of the present invention.

FIG. 4 is a diagram illustrating the turn-on sequence of the amplifier stages of the amplifier circuit of the present invention (taking the embodiment of FIG. 3 for example). The curves Cv1, Cv2, and Cv3 correspond to the source voltage of the transistor M3/M4, the source voltage of the transistor M1/M2, and the source voltage of the transistor M10/M11, respectively. As shown in FIG. 4, the first amplifier stage SA1, the second amplifier stage SA2, and the third amplifier stage SA3 are sequentially activated (i.e., the corresponding transistors are turned on) to sequentially amplify the signals.

Figure 5:
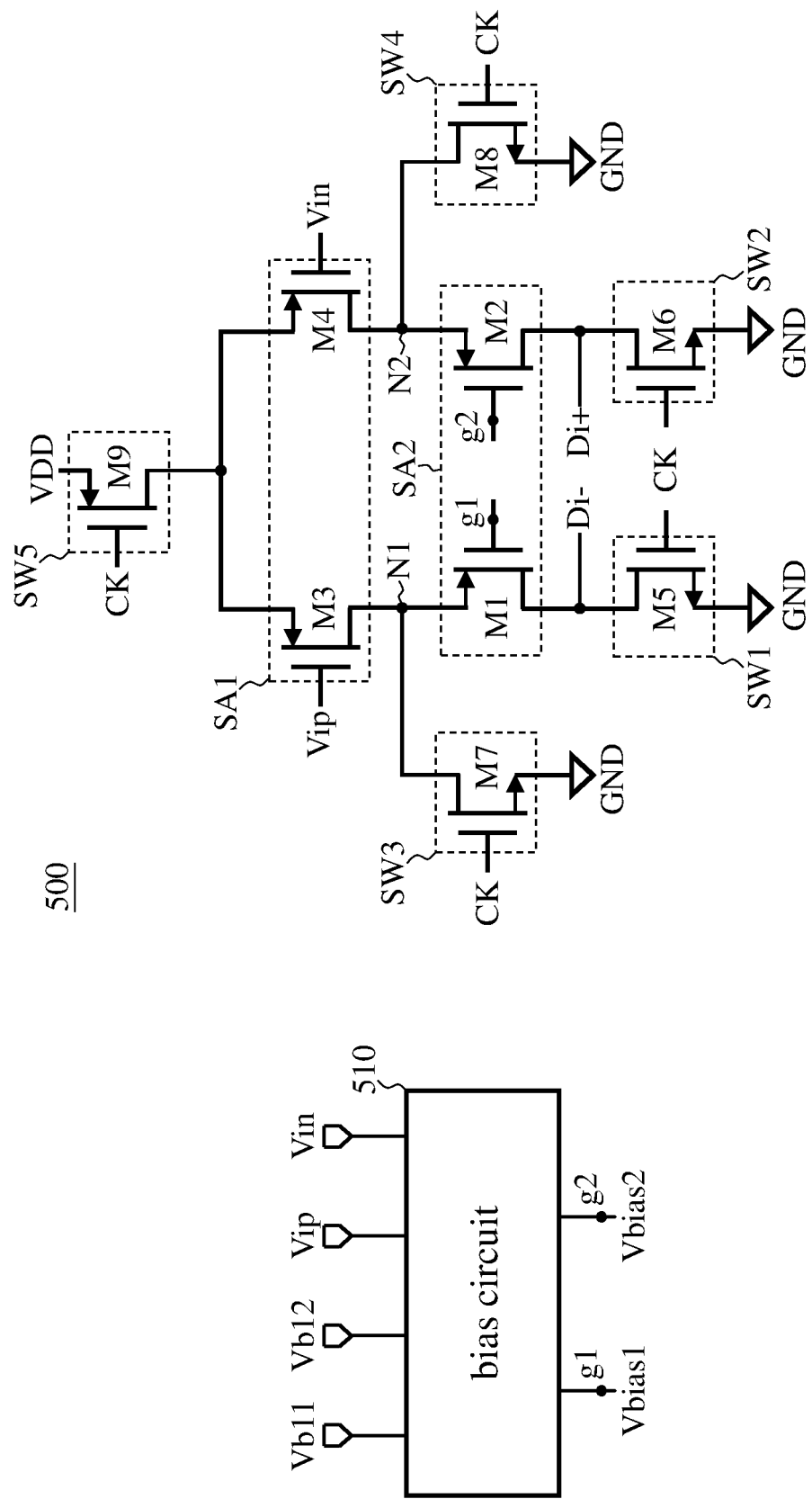
FIG. 5 is a circuit diagram of the amplifier circuit according to another embodiment of the present invention.

FIG. 5 is a circuit diagram of the amplifier circuit according to another embodiment of the present invention. The amplifier circuit 500 is similar to the amplifier circuit 200, except that the amplifier circuit 500 further includes a bias circuit 510. The bias circuit 510 generates a bias voltage Vbias1 and a bias voltage Vbias2 at the node g1 and the node g2, respectively, according to the input signal Vip, the input signal Vin, the reference voltage Vb11, and the reference voltage Vb12. The node g1 is the control terminal of the transistor M1, and the node g2 is the control terminal of the transistor M2.

Figure 6:
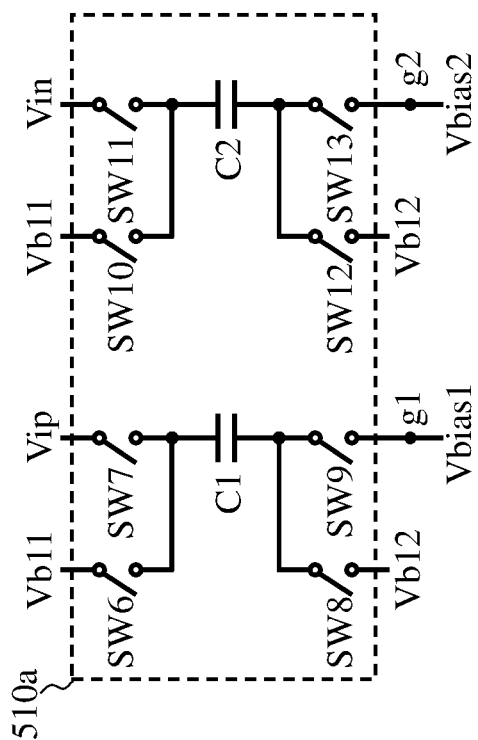
FIG. 6 is a circuit diagram of the bias circuit 510 according to an embodiment.

FIG. 6 is a circuit diagram of the bias circuit 510 according to an embodiment. The bias circuit 510a includes a capacitor C1, a capacitor C2, a switch SW6, a switch SW7, a switch SW8, a switch SW9, a switch SW10, a switch SW11, a switch SW12, and a switch SW13.

The first end of the capacitor C1 receives the reference voltage Vb11 through the switch SW6, and receives the input signal Vip through the switch SW7; the second end of the capacitor C1 receives the reference voltage Vb12 through the switch SW8 and is coupled to the node g1 through the switch SW9. The first end of the capacitor C2 receives the reference voltage Vb11 through the switch SW10 and receives the input signal Vin through the switch SW11; the second end of the capacitor C2 receives the reference voltage Vb12 through the switch SW12 and is coupled to the node g2 through the switch SW13.

The switch SW6, the switch SW7, the switch SW8, the switch SW9, the switch SW10, the switch SW11, the switch SW12, and the switch SW13 operate according to the clock CK. Specifically, when the clock CK is at the first level (e.g., the high level or logic 1), the switch SW6, the switch SW8, the switch SW10, and the switch SW12 are turned on, while the switch SW7, the switch SW9, the switch SW11, and the switch SW13 are turned off; when the clock CK is at the second level (e.g., the low level or logic 0), the switch SW6, the switch SW8, the switch SW10, and the switch SW12 are turned off, while the switch SW7, the switch SW9, the switch SW11, and the switch SW13 are turned on. In other words, the capacitors C1 and C2 charge during the reset phase of the amplifier circuit 500 and respectively couple the input signals Vip and Vin to the nodes g1 and g2 during the amplification phase of the amplifier circuit 500. Therefore, the bias voltage Vbias1 (=Vb12−Vb11+Vip) can be expressed as the operation result of the input signal Vip and a direct current (DC) voltage (Vb12−Vb11), and the bias voltage Vbias2 (=Vb12−Vb11+Vin) can be expressed as the operation result of the input signal Vin and the DC voltage (Vb12−Vb11). That is to say, in the amplification phase, the control terminal of the transistor M1 (or the transistor M2) receives the DC voltage as well as the input signal Vip (or the input signal Vin).

The DC voltage can make the transistor M1 and the transistor M2 turn on in advance. For example, when transistors M1 and M2 are PMOS transistors, the DC voltage can be negative (i.e., Vb12<Vb11). In addition, this DC voltage helps overcome the temperature, voltage, and process variations. For example, (1) when the second reference voltage VDD is lower than a designed value, reducing the voltages of the control terminals of the transistor M1 and the transistor M2 can cause the transistor M1 and the transistor M2 to be turned on more easily; and (2) when the threshold voltage of the transistor M1 and the transistor M2 changes due to the temperature change or process variation, the source-gate voltage of the transistor M1 and the transistor M2 can be changed by adjusting the DC voltage so that the transistor M1 and the transistor M2 can be turned on more easily.

Figure 7:
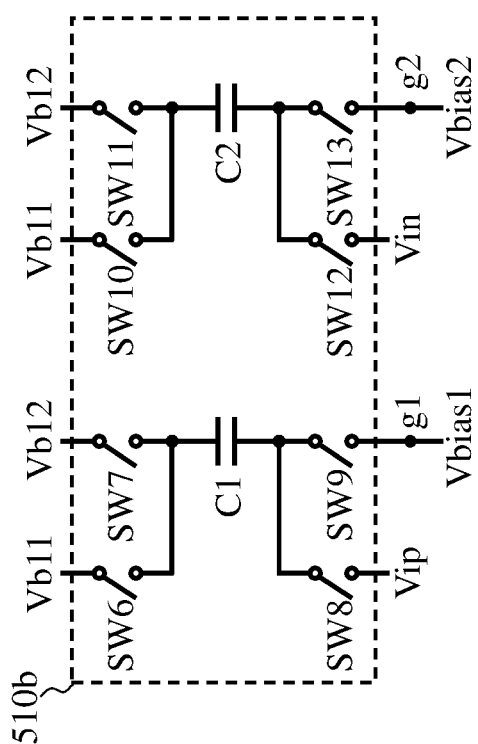
FIG. 7 is a circuit diagram of the bias circuit 510 according to an embodiment.

FIG. 7 is a circuit diagram of the bias circuit 510 according to an embodiment. The bias circuit 510b is similar to the bias circuit 510a, except that the first end of the capacitor C1 receives the reference voltage Vb12 through the switch SW7, the second end of the capacitor C1 receives the input signal Vip through the switch SW8, the first end of the capacitor C2 receives the reference voltage Vb12 through the switch SW11, and the second end of the capacitor C2 receives the input signal Vin through the switch SW12. In the embodiment of FIG. 7, the bias voltage Vbias1 is also equal to Vb12−Vb11+Vip, and the bias voltage Vbias2 is also equal to Vb12−Vb11+Vin.

Figure 8:
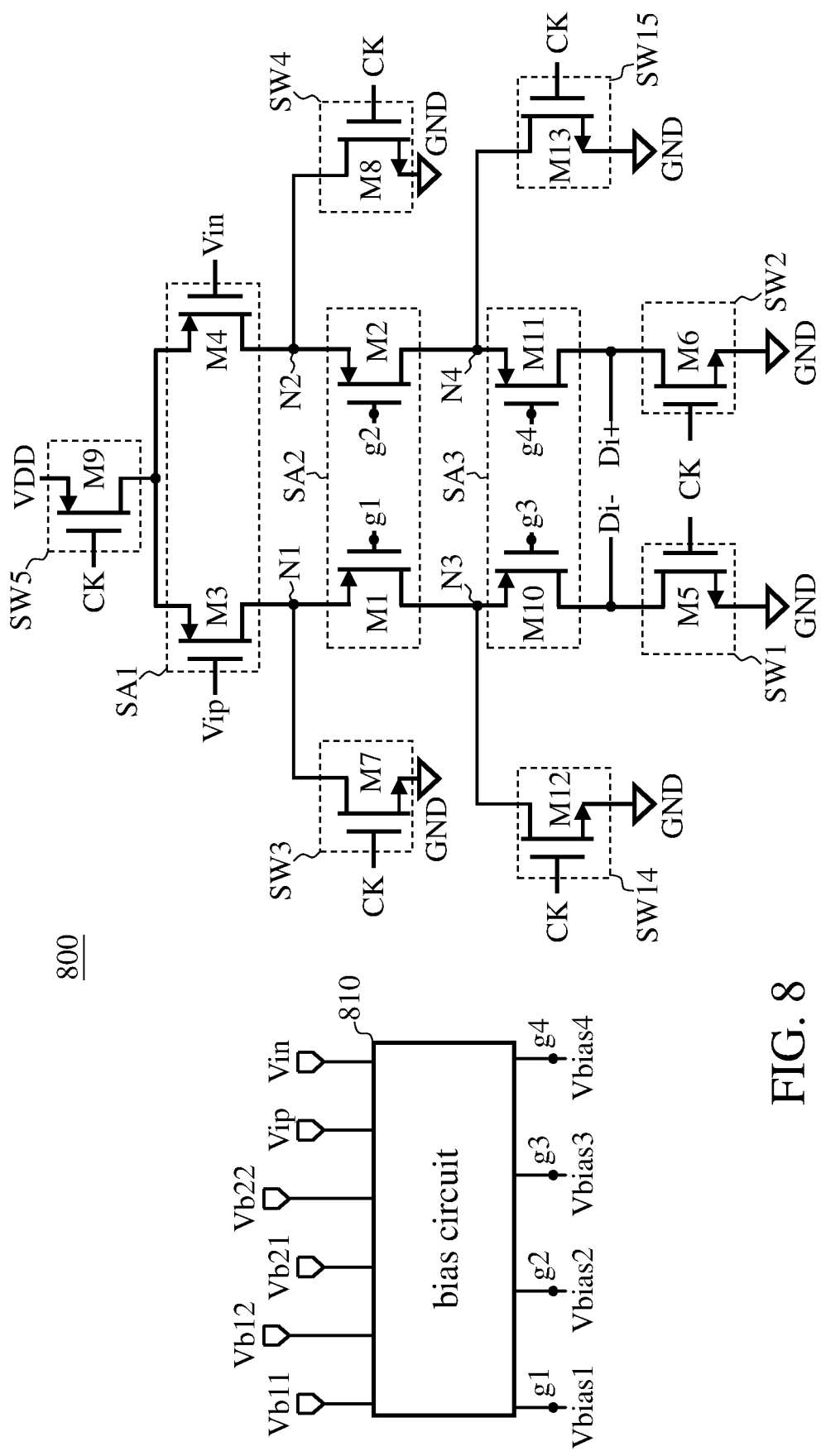
FIG. 8 is a circuit diagram of the amplifier circuit according to another embodiment of the present invention.

FIG. 8 is a circuit diagram of the amplifier circuit according to another embodiment of the present invention. The amplifier circuit 800 is similar to the amplifier circuit 300, except that the amplifier circuit 800 further includes a bias circuit 810. The bias circuit 810 generates a bias voltage Vbias1, a bias voltage Vbias2, a bias voltage Vbias3, and a bias voltage Vbias4 at the node g1, the node g2, the node g3, and the node g4, respectively, according to the input signal Vip, the input signal Vin, the reference voltage Vb11, the reference voltage Vb12, the reference voltage Vb21, and the reference voltage Vb22. The node g3 is the control terminal of the transistor M10, and the node g4 is the control terminal of the transistor M11.

Figure 9:
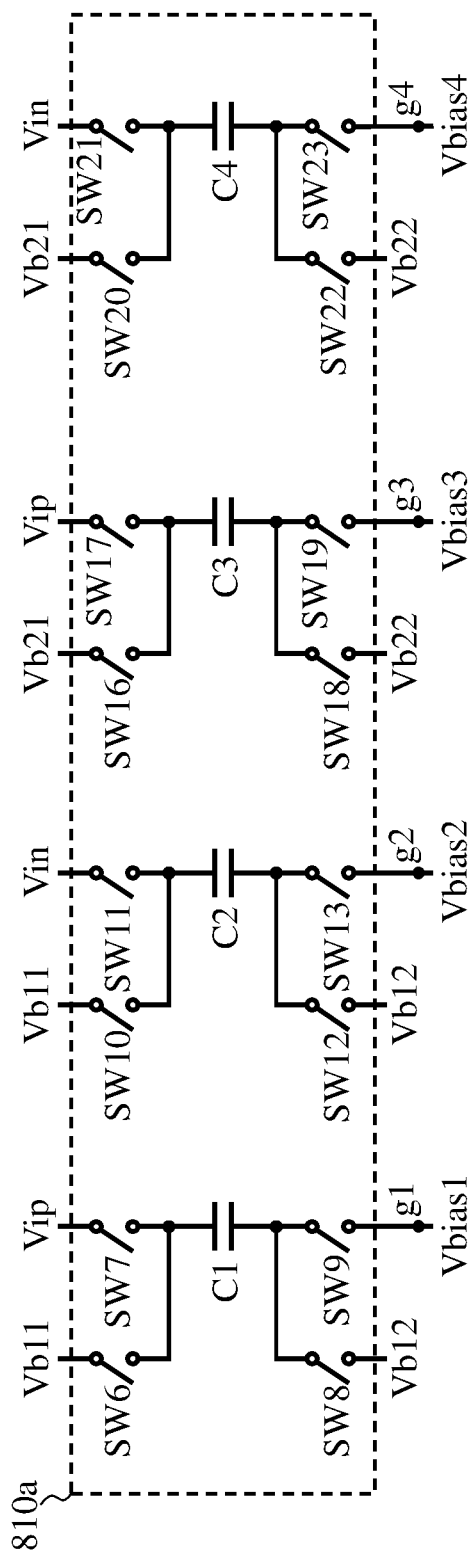
FIG. 9 is a circuit diagram of the bias circuit 810 according to an embodiment.

FIG. 9 is a circuit diagram of the bias circuit 810 according to an embodiment. The bias circuit 810a includes the capacitor C1, the capacitor C2, a capacitor C3, a capacitor C4, the switch SW6, the switch SW7, the switch SW8, the switch SW9, the switch SW10, the switch SW11, the switch SW12, the switch SW13, a switch SW16, a switch SW17, a switch SW18, a switch SW19, a switch SW20, a switch SW21, a switch SW22, and a switch SW23.

For the capacitor C1 and the capacitor C2, please refer to the discussions in connection with FIG. 6. The first end of the capacitor C3 receives the reference voltage Vb21 through the switch SW16 and receives the input signal Vip through the switch SW17; the second end of the capacitor C3 receives the reference voltage Vb22 through the switch SW18 and is coupled to the node g3 through the switch SW19. The first end of the capacitor C4 receives the reference voltage Vb21 through the switch SW20 and receives the input signal Vin through the switch SW21; the second end of the capacitor C4 receives the reference voltage Vb22 through the switch SW22 and is coupled to the node g4 through the switch SW23.

Figure 10:
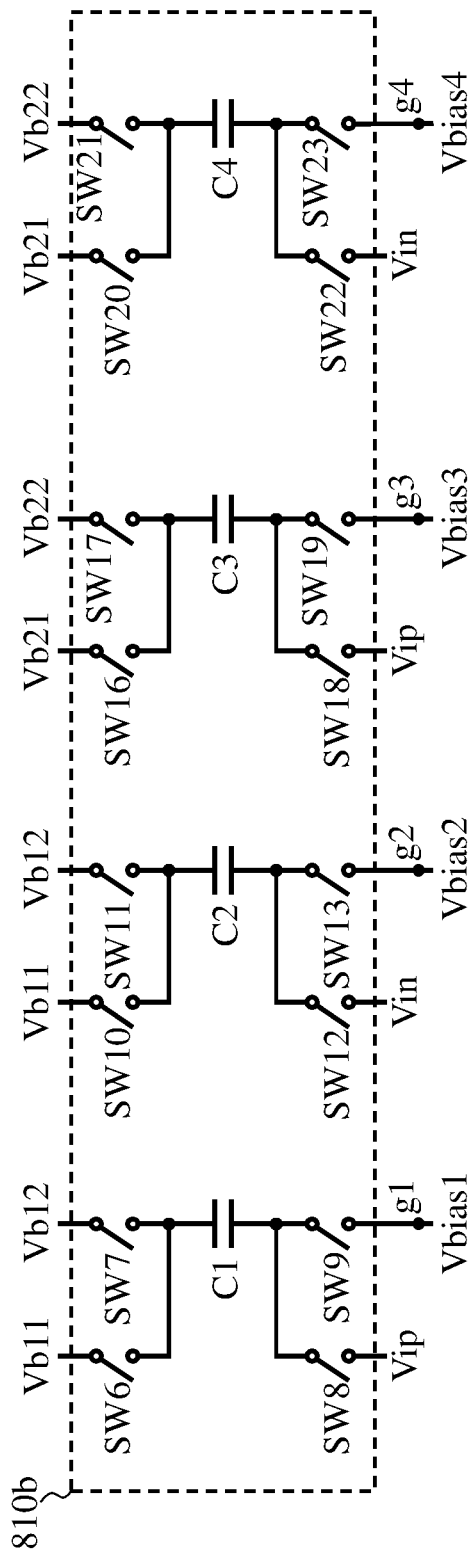
FIG. 10 is a circuit diagram of the bias circuit 810 according to an embodiment.

FIG. 10 is a circuit diagram of the bias circuit 810 according to an embodiment. The bias circuit 810b is similar to the bias circuit 810a. Since people having ordinary skill in the art can understand the difference between the bias circuit 810a and the bias circuit 810b by referring to the difference between the bias circuit 510a and the bias circuit 510b, the details are omitted herein for brevity.

In FIGS. 9-10, the switch SW16, the switch SW17, the switch SW18, the switch SW19, the switch SW20, the switch SW21, the switch SW22, and the switch SW23 operate according to the clock CK. Specifically, when the clock CK is at the first level (e.g., the high level or logic 1), the switch SW16, the switch SW18, the switch SW20, and the switch SW22 are turned on, while the switch SW17, the switch SW19, the switch SW21, and the switch SW23 are turned off; when the clock CK is at the second level (e.g., the low level or logic 0), the switch SW16, the switch SW18, the switch SW20, and the switch SW22 are turned off, while the switch SW17, the switch SW19, the switch SW21, and the switch SW23 are turned on. In other words, the capacitors C3 and C4 charge during the reset phase of the amplifier circuit 800 and respectively couple the input signals Vip and Vin to the nodes g3 and g4 during the amplification phase of the amplifier circuit 800. Therefore, the bias voltage Vbias3 (=Vb22−Vb21+Vip) can be expressed as the operation result of the input signal Vip and a DC voltage (Vb22-Vb21), and the bias voltage Vbias4 (=Vb22−Vb21+Vin) can be expressed as the operation result of the input signal Vin and the DC voltage (Vb22-Vb21). That is to say, in the amplification phase, the control terminal of the transistor M10 (or the transistor M11) receives the DC voltage as well as the input signal Vip (or the input signal Vin).

Figure 11:
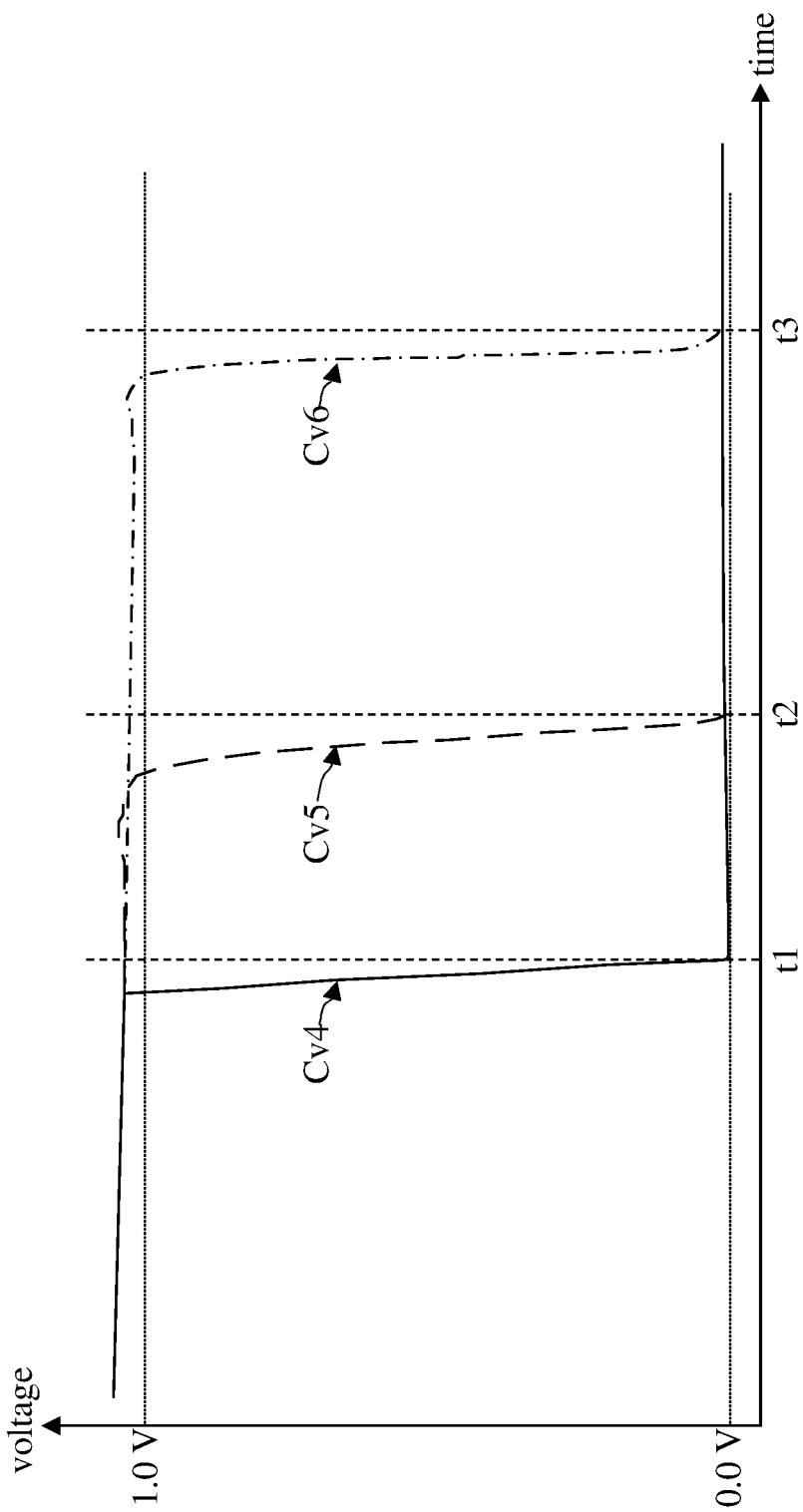
FIG. 11 shows the voltage-time diagram for the comparison of the operating speed of the amplifier circuits of this disclosure.

FIG. 11 shows the voltage-time diagram for the comparison of the operating speed of the amplifier circuits of this disclosure. The curve Cv4 is equivalent to clock CK; the curve Cv5 corresponds to the amplifier circuit 500; the curve Cv6 corresponds to the amplifier circuit 200. When the clock CK transitions from the first level to the second level (i.e., corresponding to the time point t1), the amplifier circuit 200 and the amplifier circuit 500 leave the reset phase and enter the amplification phase. The amplifier circuit 500 outputs the amplified signal at the time point t2, whereas the amplifier circuit 200 does not output the amplified signal until the time point t3. It can be observed that the bias circuit 510 can greatly improve the operating speed of the amplifier circuit. Similarly, the bias circuit 810 can also greatly improve the operating speed of the amplifier circuit.

The aforementioned amplifier circuits 200, 300, 500, and 800 can be used as the preamplifiers of the comparators but are not limited thereto.

In other embodiments, the PMOS transistors and NMOS transistors in the embodiments discussed above can be replaced by the NMOS transistors and PMOS transistors, respectively. People having ordinary skill in the art know how to adjust the clock CK and the reference voltage accordingly to realize the embodiments discussed above.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An amplifier circuit having a first output terminal and a second output terminal, comprising:
   a first transistor having a first terminal, a second terminal, and a first control terminal, the second terminal being coupled to the first output terminal;
   a second transistor having a third terminal, a fourth terminal, and a second control terminal, the fourth terminal being coupled to the second output terminal;
   a third transistor having a fifth terminal, a sixth terminal, and a third control terminal, the sixth terminal being coupled to the first terminal, and the third control terminal receiving a first input signal;

a fourth transistor having a seventh terminal, an eighth terminal, and a fourth control terminal, the seventh terminal being coupled to the fifth terminal, the eighth terminal being coupled to the third terminal, and the fourth control terminal receiving a second input signal;

a first switch having a ninth terminal and a tenth terminal, the ninth terminal being coupled to a first reference voltage, and the tenth terminal being coupled to the first output terminal;

a second switch having an eleventh terminal and a twelfth terminal, the eleventh terminal being coupled to the first reference voltage, and the twelfth terminal being coupled to the second output terminal;

a third switch having a thirteenth terminal and a fourteenth terminal, the thirteenth terminal being coupled to the first reference voltage, and the fourteenth terminal being coupled to the first terminal and the sixth terminal;

a fourth switch having a fifteenth terminal and a sixteenth terminal, the fifteenth terminal being coupled to the first reference voltage, and the sixteenth terminal being coupled to the third terminal and the eighth terminal; and a fifth switch having a seventeenth terminal and an eighteenth terminal, the seventeenth terminal being coupled to a second reference voltage, and the eighteenth terminal being coupled to the fifth terminal and the seventh terminal;

wherein the first transistor and the second transistor function as a common-source amplifier.

2. The amplifier circuit of claim 1 further comprising:
a bias circuit configured to generate a first bias voltage and a second bias voltage according to a third reference voltage, a fourth reference voltage, the first input signal, and the second input signal;

wherein the first bias voltage is an operation result of the first input signal, the third reference voltage, and the fourth reference voltage, the second bias voltage is an operation result of the second input signal, the third reference voltage, and the fourth reference voltage, the first control terminal receives the first bias voltage, and the second control terminal receives the second bias voltage.

3. The amplifier circuit of claim 2, wherein when the first switch, the second switch, the third switch, and the fourth switch are turned on, the fifth switch is turned off, and when the first switch, the second switch, the third switch, and the fourth switch are turned off, the fifth switch is turned on.

4. The amplifier circuit of claim 1, wherein the first control terminal receives the first input signal, and the second control terminal receives the second input signal.

5. The amplifier circuit of claim 1 further comprising:
a fifth transistor having a nineteenth terminal, a twentieth terminal, and a fifth control terminal, the nineteenth terminal being coupled to the second terminal, and the twentieth terminal being coupled to the first output terminal;

a sixth transistor having a twenty-first terminal, a twenty-second terminal, and a sixth control terminal, the twenty-first terminal is coupled to the fourth terminal, and the twenty-second terminal is coupled to the second output terminal;

a sixth switch having a twenty-third terminal and a twenty-fourth terminal, the twenty-third terminal being coupled to the first reference voltage, and the twenty-fourth terminal being coupled to the second terminal and the nineteenth terminal; and a seventh switch having a twenty-fifth terminal and a twenty-sixth terminal, the twenty-fifth terminal being coupled to the first reference voltage, and the twenty-sixth terminal being coupled to the fourth terminal and the twenty-first terminal.

6. The amplifier circuit of claim 5 further comprising:
a bias circuit configured to generate a first bias voltage, a second bias voltage, a third bias voltage, and a fourth bias voltage according to a third reference voltage, a fourth reference voltage, a fifth reference voltage, a sixth reference voltage, the first input signal, and the second input signal;

wherein the first bias voltage is an operation result of the first input signal, the third reference voltage, and the fourth reference voltage, the second bias voltage is an operation result of the second input signal, the third reference voltage, and the fourth reference voltage, the third bias voltage is an operation result of the first input signal, the fifth reference voltage, and the sixth reference voltage, the fourth bias voltage is an operation result of the second input signal, the fifth reference voltage, and the sixth reference voltage, the first control terminal receives the first bias voltage, the second control terminal receives the second bias voltage, the fifth control terminal receives the third bias voltage, and the sixth control terminal receives the fourth bias voltage.

7. The amplifier circuit of claim 6, wherein when the first switch, the second switch, the third switch, the fourth switch, the sixth switch, and the seventh switch are turned on, the fifth switch is turned off, and when the first switch, the second switch, the third switch, the fourth switch, the sixth switch, and the seventh switch are turned off, the fifth switch is turned on.

8. The amplifier circuit of claim 5, wherein the first control terminal and the fifth control terminal receive the first input signal, and the second control terminal and the sixth control terminal receive the second input signal.

9. The amplifier circuit of claim 1, wherein the first input signal and the second input signal are a pair of differential input signals, and the first output terminal and the second output terminal output a pair of differential output signals.

10. An amplifier circuit that outputs a pair of differential output signals through a first output terminal and a second output terminal, comprising:
a first amplifier stage electrically connected to a first node and a second node and configured to amplify a pair of differential input signals;

a second amplifier stage electrically connected to the first node and the second node and coupled to the first output terminal and the second output terminal;

a first switch coupled between the first output terminal and a first reference voltage;

a second switch coupled between the second output terminal and the first reference voltage;

a third switch coupled between the first node and the first reference voltage;

a fourth switch coupled between the second node and the first reference voltage; and a fifth switch coupled between a second reference voltage and the first amplifier stage;

wherein the second amplifier stage functions as a common-source amplifier.

11. The amplifier circuit of claim 10, wherein the pair of differential input signals comprises a first input signal and a second input signal, the first amplifier stage comprises a first transistor and a second transistor, the second amplifier stage comprises a third transistor and a fourth transistor, the first transistor is coupled between the fifth switch and the first node, the second transistor is coupled between the fifth switch and the second node, the third transistor is coupled between the first node and the first output terminal, the fourth transistor is coupled between the second node and the second output terminal, a first control terminal of the first transistor receives the first input signal, and a second control terminal of the second transistor receives the second input signal.

12. The amplifier circuit of claim 11 further comprising:
a bias circuit configured to generate a first bias voltage and a second bias voltage according to a third reference voltage, a fourth reference voltage, the first input signal, and the second input signal;
wherein the first bias voltage is an operation result of the first input signal, the third reference voltage, and the fourth reference voltage, the second bias voltage is an operation result of the second input signal, the third reference voltage, and the fourth reference voltage, a third control terminal of the third transistor receives the first bias voltage, and a fourth control terminal of the fourth transistor receives the second bias voltage.

13. The amplifier circuit of claim 12, wherein when the first switch, the second switch, the third switch, and the fourth switch are turned on, the fifth switch is turned off, and when the first switch, the second switch, the third switch, and the fourth switch are turned off, the fifth switch is turned on.

14. The amplifier circuit of claim 11, wherein a third control terminal of the third transistor receives the first input signal, and a fourth control terminal of the fourth transistor receives the second input signal.

15. The amplifier circuit of claim 10 further comprising:
a third amplifier stage electrically connected to a third node and a fourth node and coupled to the first output terminal and the second output terminal;
a sixth switch coupled between the third node and the first reference voltage; and
a seventh switch coupled between the fourth node and the first reference voltage;
wherein the second amplifier stage is further electrically connected to the third node and the fourth node.

16. The amplifier circuit of claim 15, wherein the pair of differential input signals comprises a first input signal and a second input signal, the first amplifier stage comprises a first transistor and a second transistor, the second amplifier stage comprises a third transistor and a fourth transistor, the third amplifier stage comprises a fifth transistor and a sixth transistor, the first transistor is coupled between the fifth switch and the first node, the second transistor is coupled between the fifth switch and the second node, the third transistor is coupled between the first node and the third node, the fourth transistor is coupled between the second node and the fourth node, the fifth transistor is coupled between the third node and the first output terminal, the sixth transistor is coupled between the fourth node and the second output terminal, a first control terminal of the first transistor receives the first input signal, and a second control terminal of the second transistor receives the second input signal.

17. The amplifier circuit of claim 16 further comprising:
a bias circuit configured to generate a first bias voltage, a second bias voltage, a third bias voltage, and a fourth bias voltage according to a third reference voltage, a fourth reference voltage, a fifth reference voltage, a sixth reference voltage, the first input signal, and the second input signal;
wherein the first bias voltage is an operation result of the first input signal, the third reference voltage, and the fourth reference voltage, the second bias voltage is an operation result of the second input signal, the third reference voltage, and the fourth reference voltage, the third bias voltage is an operation result of the first input signal, the fifth reference voltage, and the sixth reference voltage, the fourth bias voltage is an operation result of the second input signal, the fifth reference voltage, and the sixth reference voltage, a third control terminal of the third transistor receives the first bias voltage, a fourth control terminal of the fourth transistor receives the second bias voltage, a fifth control terminal of the fifth transistor receives the third bias voltage, and a sixth control terminal of the sixth transistor receives the fourth bias voltage.

18. The amplifier circuit of claim 17, wherein when the first switch, the second switch, the third switch, the fourth switch, the sixth switch, and the seventh switch are turned on, the fifth switch is turned off, and when the first switch, the second switch, the third switch, the fourth switch, the sixth switch, and the seventh switch are turned off, the fifth switch is turned on.

19. The amplifier circuit of claim 16, wherein a third control terminal of the third transistor receives the first input signal, a fourth control terminal of the fourth transistor receives the second input signal, a fifth control terminal of the fifth transistor receives the first input signal, and a sixth control terminal of the sixth transistor receives the second input signal.

20. An amplifier circuit having a first output terminal and a second output terminal, comprising:
a first transistor having a first terminal, a second terminal, and a first control terminal, the second terminal being coupled to the first output terminal;
a second transistor having a third terminal, a fourth terminal, and a second control terminal, the fourth terminal being coupled to the second output terminal;
a third transistor having a fifth terminal, a sixth terminal, and a third control terminal, the sixth terminal being coupled to the first terminal, and the third control terminal receiving a first input signal;
a fourth transistor having a seventh terminal, an eighth terminal, and a fourth control terminal, the seventh terminal being coupled to the fifth terminal, the eighth terminal being coupled to the third terminal, and the fourth control terminal receiving a second input signal;
a first switch having a ninth terminal and a tenth terminal, the ninth terminal being coupled to a first reference voltage, and the tenth terminal being coupled to the first output terminal;
a second switch having an eleventh terminal and a twelfth terminal, the eleventh terminal being coupled to the first reference voltage, and the twelfth terminal being coupled to the second output terminal;
a third switch having a thirteenth terminal and a fourteenth terminal, the thirteenth terminal being coupled to the first reference voltage, and the fourteenth terminal being coupled to the first terminal and the sixth terminal;
a fourth switch having a fifteenth terminal and a sixteenth terminal, the fifteenth terminal being coupled to the first reference voltage, and the sixteenth terminal being coupled to the third terminal and the eighth terminal; and a fifth switch having a seventeenth terminal and an eighteenth terminal, the seventeenth terminal being coupled to a second reference voltage, and the eighteenth terminal being coupled to the fifth terminal and the seventh terminal;

wherein the first control terminal receives the first input signal, and the second control terminal receives the second input signal.

* * * * *